(12) United States Patent
Vesterinen et al.

(10) Patent No.: US 11,515,851 B2
(45) Date of Patent: Nov. 29, 2022

(54) JOSEPHSON TRAVELING WAVE PARAMETRIC AMPLIFIER

(71) Applicant: Teknologian tutkimuskeskus VTT OY, Espoo (FI)

(72) Inventors: Visa Vesterinen, Espoo (FI); Juha Hassel, Espoo (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 0 days.

(21) Appl. No.: 17/424,983

(22) PCT Filed: Jan. 8, 2020

(86) PCT No.: PCT/FI2020/050012
§ 371 (c)(1),
(2) Date: Jul. 22, 2021

(87) PCT Pub. No.: WO2020/152393
PCT Pub. Date: Jul. 30, 2020

(65) Prior Publication Data
US 2022/0094320 A1 Mar. 24, 2022

(30) Foreign Application Priority Data
Jan. 24, 2019 (FI) .................................. 20195045

(51) Int. Cl.
*H03F 19/00* (2006.01)
*H01L 39/22* (2006.01)
(Continued)

(52) U.S. Cl.
CPC ........... *H03F 19/00* (2013.01); *H01L 39/223* (2013.01); *H01L 39/2493* (2013.01);
(Continued)

(58) Field of Classification Search
CPC ... H03F 19/00; H03F 7/00; H03F 7/04; H01L 39/223; H01L 39/2493; H01P 3/003; H03G 3/00
(Continued)

(56) References Cited

U.S. PATENT DOCUMENTS

| 4,344,052 A * | 8/1982 | Davidson | H01Q 13/206 |
| | | | 331/107 S |
| 11,223,355 B2 * | 1/2022 | Smith | H03K 17/92 |

(Continued)

FOREIGN PATENT DOCUMENTS

| JP | 2009225213 A | 10/2009 |
| WO | WO2016127021 A1 | 8/2016 |
| WO | WO W02017149319 A1 | 9/2017 |

OTHER PUBLICATIONS

Liveri et al (Year: 2022, IEEE Radar Conf ), Microwave Quantum Radar using a Josephson Traveling Wave Parametric Amplifier (Year: 2022) (Year: 2022).*

(Continued)

*Primary Examiner* — Arnold M Kinkead
(74) *Attorney, Agent, or Firm* — Laine IP Oy (57) ABSTRACT

According to an example aspect of the present invention, there is provided a travelling wave parametric amplifier comprising a waveguide transmission line comprising therein at least ten Josephson elements, wherein each of the at least ten Josephson element comprises a loop, with exactly one Josephson junction of first size on one half of the loop and at least two Josephson junctions of a second size on a second half of the loop, the second size being larger than the first size, a flux bias line configured to generate a magnetic flux threading each of the at least one loop, and a set of resistors coupled with the flux bias line.

19 Claims, 4 Drawing Sheets

(51) Int. Cl.
*H01L 39/24* (2006.01)
*H01P 3/00* (2006.01)
*H03F 7/00* (2006.01)
*H03F 7/04* (2006.01)
*H03G 3/00* (2006.01)

(52) U.S. Cl.
CPC ............... *H01P 3/003* (2013.01); *H03F 7/00* (2013.01); *H03F 7/04* (2013.01); *H03G 3/00* (2013.01)

(58) Field of Classification Search
USPC ........... 331/107 S, 107 T; 330/4.6, 144, 278; 257/31; 326/3; 333/222; 343/792.5
See application file for complete search history.

(56) References Cited

U.S. PATENT DOCUMENTS

2012/0098594 A1  4/2012  Zmuidzinas et al.
2018/0232653 A1  8/2018  Selvanayagam et al.

OTHER PUBLICATIONS

Arpit Ranadive et al, Nature Comm. 2022, Kerr Reversal in Josephson meta-material and traveling wave parametric amplification (Year: 2022).*
Atsushi et al: Single-photon quantum regime of artificial radiation pressure on a surface acoustic wave resonator. arxiv.org, Cornell University Library, Aug. 10, 2018.
Bell et al: Traveling Wave Parametric Amplifier based on a chain of Coupled Asymmetric SQUIDs. arxiv.org, Corenell University Library, Sep. 15, 2015, pp. 1-9.
Frattini et al: 3-Wave Mixing Josephson Dipole Element. arxiv.org, Cornell University Library, Jul. 17, 2019, pp. 1-5.
Frattini et al: Optimizing the nonlinearity and dissipation of a SNAIL Parametric Amplifier for dynamic range. arxiv.org, Cornell University Library Jun. 15, 2018.
Lindström: Microphoton 2016. Apr. 14, 2016. URL: http://www.npl.co.uk/upload/pdf/20160413-14_microphoton_booklet.pdf.
Rehak et al: Parametric amplification by coupled flux qubits. arxiv.org, Cornell University Library, Dec. 27, 2013, pp. 1-4.
Schwarz et al: Gradiometric flux qubits with tunable gap. arxiv.org, Cornell University Library Apr. 6, 2013, pp. 1-23.
Simbierowicz et al: Flux-driven Josephson parametric amplifier for sub-GHz frequencies fabricated with side-wall passivated spacer junction technology. arxiv.org, Cornell University Library, May 18, 2018, pp. 1-23.
Tan et al: Design of a Uniplanar Resonance Phase-Matched Josephson Travelling-Wave Parametric Amplifier. 10th UK, Europe, China Millimeter Waves and Terahertz Technology (UCMMT), IEEE Xplore Digital Library, Sep. 11, 2017, pp. 1-4.
Zorin et al: Traveling-Wave Parametric Amplifier Based on Three-Wave Mixing in a Josephson Metamaterial. arxiv.org, Cornell University Library, May 8, 2017, pp. 1-3.
Zorin: Josephson traveling-wave parametric amplifier with three-wave mixing. arxiv.org, Cornell University Library, Sep. 19, 2016, pp. 1-8.

* cited by examiner

| Providing a waveguide transmission line comprising therein at least ten Josephson elements, wherein each of the at least ten Josephson elements comprises a loop, with one junction of a first size on one half of the loop and at least two junctions of a second size on a second half of the loop, the second size being larger than the first size | 410 |

| Providing a flux bias line configured to generate a magnetic field thrading through each of the at least one loop | 420 |

| Providing a set of resistors coupled with the flux bias line | 420 |

FIGURE 4

JOSEPHSON TRAVELING WAVE PARAMETRIC AMPLIFIER

FIELD

The present invention relates to superconducting traveling wave parametric amplifiers, TWPAs.

BACKGROUND

Parametric amplifiers are in effect mixers, wherein a weaker input signal may be amplified by mixing it with stronger pump signal, producing a stronger output signal as a result. Parametric amplifiers rely on a nonlinear response of a physical system to generate amplification. Such amplifiers may comprise standing wave parametric amplifiers or traveling wave parametric amplifiers, wherein a traveling wave parametric amplifier uses a series of nonlinear elements distributed along a transmission line, such as a coplanar waveguide, for example. In case the nonlinear elements comprise Josephson junctions, the amplifier may be referred to as a Josephson traveling wave parametric amplifier, JTWPA. In a JTWPA, the Josephson junctions are maintained in superconducting condition and carry a supercurrent.

In use, a signal is added to the strong oscillator signal, resulting in a sum signal wherein an amplitude envelope exhibits variance at a frequency which is a difference between the signal and oscillator frequencies. Since in the waveguide transmission line, a phase velocity is dependent on amplitude, a phase of the summed signal at the end of the line will vary in accordance with a difference in the two frequencies. In effect, the nonlinear waveguide transmission line converts amplitude modulation into phase modulation. In case the non-linearity is strong enough, this will result in a gain at the signal frequency.

SUMMARY OF THE INVENTION

According to some aspects, there is provided the subject-matter of the independent claims. Some embodiments are defined in the dependent claims.

According to a first aspect of the present invention, there is provided a travelling wave parametric amplifier comprising a waveguide transmission line comprising therein at least ten Josephson elements, wherein each of the at least ten Josephson element comprises a loop, with exactly one Josephson junction of first size on one half of the loop and at least two Josephson junctions of a second size on a second half of the loop, the second size being larger than the first size, a flux bias line configured to generate a magnetic flux threading each of the at least one loop, and a set of resistors coupled with the flux bias line.

According to a second aspect of the present invention, there is provided a method for manufacturing a traveling wave parametric amplifier comprising providing a waveguide transmission line comprising therein at least ten Josephson elements, wherein each of the at least ten Josephson elements comprises a loop, with exactly one junction of first size on one half of the loop and at least two junctions of a second size on a second half of the loop, the second size being larger than the first size, providing a flux bias line configured to generate a magnetic field threading each of the at least one loop, and providing a set of resistors coupled with the flux bias line.

EMBODIMENTS

In accordance with solutions disclosed herein, a traveling wave parametric amplifier may be made less sensitive to errors in the size of smaller Josephson junctions in a Josephson element comprising larger and smaller Josephson junctions, by selecting parameters suitably. Further, a gradiometric layout of a Josephson element is disclosed, which renders the element sensitive to a magnetic field gradient only, and a flux bias line in the traveling wave parametric amplifier is provided to generate such a field gradient. Further, the transmission line may be tapered. Overall, using one of more of these enhancements, a traveling wave parametric amplifier may be more suitably used in real-life applications as its operation will be less sensitive to disturbances and manufacturing defects.

Figure 1:
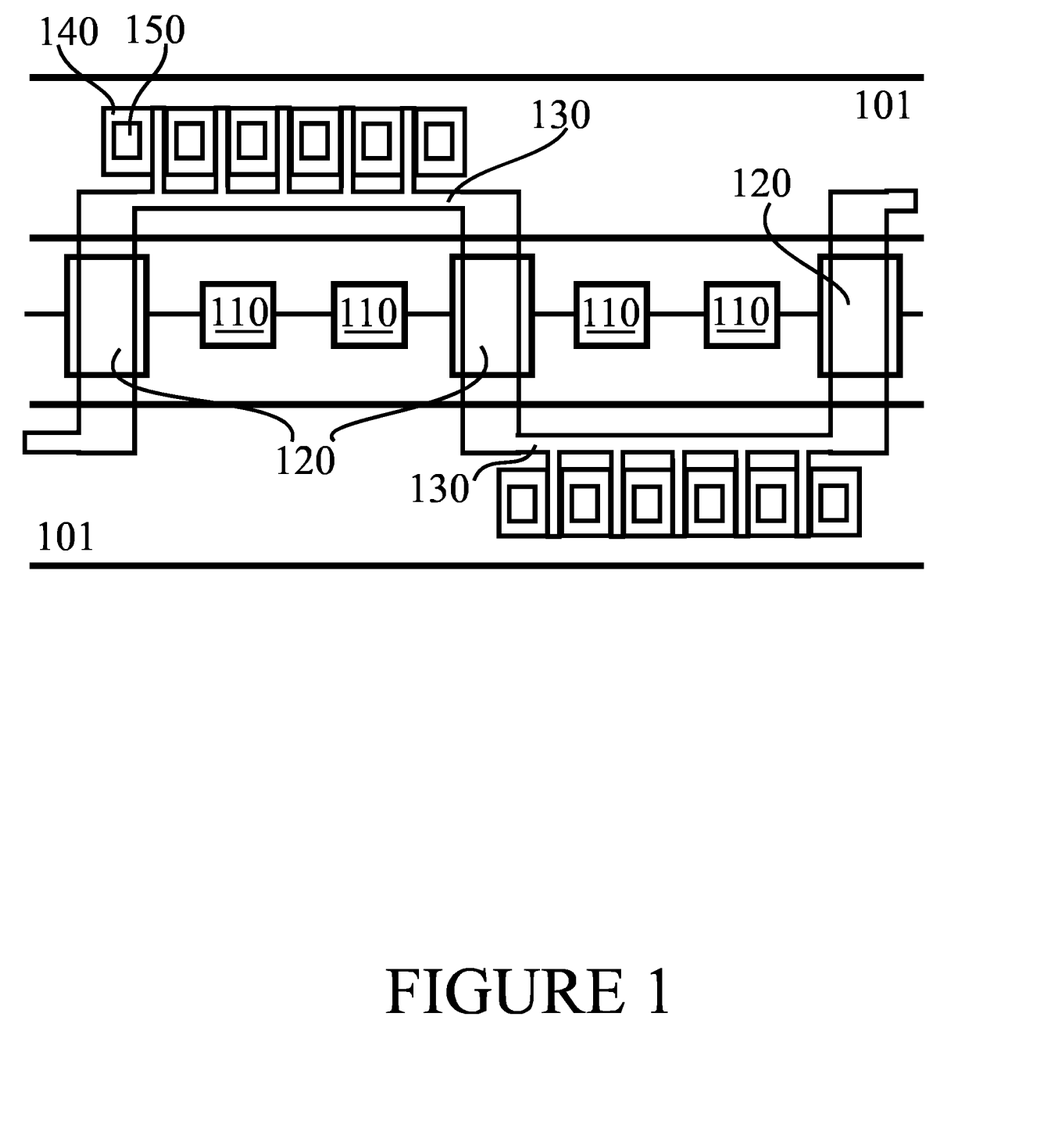
FIG. 1 illustrates an example amplifier in accordance with at least some embodiments of the present invention.

FIG. 1 illustrates an example amplifier in accordance with at least some embodiments of the present invention. Overall, for example in quantum computation, signals may be attenuated for transmission even to a single-photon or a near-single-photon regime. Detecting such signals presents challenges owing to their low amplitude. Therefore, suitable amplifiers may be employed to increase the amplitudes of received signals prior to their provision to detector elements, where the information encoded into these received signals may be recovered. As another example, a single-photon regime communication may be employed in communicating encryption keys in a secure manner using quantum communication, such that eavesdropping without detection is made very difficult.

The present disclosure is focuses on a superconductive realization of the TWPA, where the center trace of a transmission line is an array of Josephson junction based elements, known as Josephson elements, that constitute a non-linear inductance. The non-linearity allows for a mixing process that provides power gain for a weak signal that propagates along the same direction as a strong radio frequency, rf, pump tone. The strength of the pump tone is measured with the ratio between the pump current amplitude Ip and the critical current Ic of the Josephson element. The nature of the non-linearity depends on the arrangement of Josephson junctions within the element. The simplest realization is the use of a single Josephson junction as the non-linear element: the associated Taylor expansion of the inductance is a constant plus a term proportional to $(Ip/Ic)^2$, that is, a Kerr non-linearity. While the Kerr term results in a desired mixing process, it also changes the wavevector of the pump tone, an effect that has to be compensated with dispersion engineering. The balancing of the wavevectors, also called phase matching, allows an exponential increase of the TWPA gain as a function of the device length. Due to the typically narrowband dispersive features embedded into the transmission line, the center frequency of gain is a fixed quantity in this example of the TWPA.

There are new solutions that target the realization of a Kerr-free non-linearity by introducing a magnetic flux degree of freedom to the Josephson element. In the Taylor expansion of the inductance, this alternative non-linearity is a term proportional to Ip/Ic. Kerr-free operation is beneficial as no dispersion engineering is necessary to achieve phase matching. The pump frequency, which sets the center frequency of gain, can be freely selected. Main features of a typical Kerr-free element include (i) a superconductive magnetic pick-up loop that can be pictured as two half-loops connected together, (ii) the interruption of the two halves with an unequal number of Josephson junctions, and (iii) a finite magnetic flux bias that makes a screening current flow in the loop according to the principle of flux quantization. Particular weaknesses of the Kerr-free element, in the realizations presented so far, are (i) sensitivity to magnetic interference, and (ii) sensitivity to inhomogeneity of the magnetic bias field, especially in arrays consisting of multiple elements.

Furthermore, a generic problem in TWPAs is depletion of the pump current. This is due to either dissipation in the transmission line, or transfer of power from the pump to the amplified signal if the TWPA is operated close to saturation. The pump depletion limits the TWPA gain because the mixing process relies on a suitable ratio between Ip and Ic. Another generic problem in TWPAs is the fabrication spread of the Ic, causing inhomogeneity of the electrical parameters of the transmission line.

The JTWPA of FIG. 1 comprises a waveguide, which comprises Josephson elements 110 and parallel-plate capacitors 120. The Josephson elements 110 are connected with each other with waveguides capable of conveying electromagnetic waves, as is known in the art. The waveguide, a section of which is illustrated in FIG. 1, has an input port at the left, arranged to receive the signal to be amplified and a strong oscillator signal, which are mixed in the waveguide in the non-linear Josephson elements 110. At an output port at the right, the phase-modulated amplified signal is obtained as output. Two wiring layer elements 101 may each comprise a superconductor covered with an insulator, for example.

In general, a Josephson element, such as a single junction, a superconducting quantum interference device (SQUID), an asymmetric SQUID, or a more complex Josephson element such as a flux-qubit-like circuit, can be described using an effective potential energy:

$$U_{\mathit{eff}}(\varphi)/E_j = c_2\varphi^2 + c_3\varphi^3 + c_4\varphi^4 + \ldots$$

here $E_j$ is the Josephson energy, and $\varphi$ is the superconducting phase. The $c_2$ term relates to critical current and linear part of Josephson inductance, the $c_3$ term relates to 3-wave mixing and the $c_4$ term relates to 4-wave mixing, which is also known as the Kerr nonlinearity.

Normally single junctions and SQUIDs, including asymmetric SQUIDs, have $c_3=0$, whereby 3-wave mixing does not occur, and non-linearity is provided by the Kerr term. 3-wave mixing means the ability to pump at twice the input frequency, which is desirable. 3-wave mixing could be activated by injecting a dc current, but however, the Kerr term would remain non-zero.

Nonlinearity provided by the Kerr term is associated with the need for resonant phase matching, in practice the pump signal is given a small phase increment at regular intervals along the transmission line. This is due to the pump having a different phase velocity from the signal (at the frequency fP) and the idler (at the frequency fI). This phase mismatch increases with the pump power. Conservation of energy implies the existence of an idler frequency at the output, the frequency of which is located at the "mirror image" of the signal frequency with respect to the pump, fI=2fP−fS. In detail, in the Kerr mode, phase mismatch and gain depend on the same parameter, the Kerr nonlinearity. The three frequencies are related by fS+fI=fP in the case of 3-wave mixing. To minimize the amount of reflections, both ends of the TWPA further need to have good impedance match at each of the frequencies fI, fS and fP.

Consequently, it would be preferable to operate a TWPA using 3-wave mixing without 4-wave mixing, that is, using the $c_3$-term with the Kerr nonlinearity suppressed. Thus the amplifier could be constructed without equipment for providing the periodic phase increments which are necessitated by the Kerr mode. In the 3-wave mode, phase mismatch and gain depend on different nonlinear terms.

In particular, the present invention sets out to solve, or at least alleviate, the following problems: firstly, sensitivity to magnetic interference in a Kerr-free TWPA. The interference may compromise the ultralow-noise performance of the TWPA. Secondly, sensitivity to inhomogeneity of the magnetic bias field in the Kerr-free TWPA. Thirdly, fabrication spread of the Josephson junctions affects the critical current in the TWPA. These effects cause variation of the transmission line impedance, a potential source of reflections. The reflections can cause standing waves that introduce periodicity into the frequency response of the TWPA, or even prevent the mixing process from providing gain. Fourthly, depletion of pump current in the TWPA. This limits the maximum gain of the TWPA.

A. B. Zorin describes in [1] a solution, wherein the balance between $c_3$ and $c_4$ mixing can be controlled by applying a suitable external magnetic field to rf-SQUIDs. Thus predominantly 3-wave mixing may be attained in Zorin's system.

Frattini et al. describe in [2] a flux-qubit-like circuit which simultaneously nulls the Kerr mixing term and maximizes the 3-wave mixing term. This circuit, which the authors of document [2] name "Superconducting Nonlinear Asymmetric Inductive eLement", SNAIL, is modified as described herein to arrive at the Josephson element 110 in the present embodiments. In detail, in [2], a Josephson element has three large Josephson junctions on one half of a loop and one small Josephson junction on the other half of the loop. In the present solution, a Josephson element with at least two large Josephson junctions on one half of a loop and one small Josephson junction on the other half of the loop is used. This will be illustrated later in FIGS. 2 and 3.

The JTWPA of FIG. 1 has, in the waveguide, parallel-plate capacitors 120, interspersed between the Josephson elements 110. Two Josephson elements 110 between every two parallel plate capacitors 120 is one example, to which the invention is not limited, indeed, in various embodiments there may be three or more Josephson elements 110 between every two parallel plate capacitors 120. The parallel plate capacitors 120 form the majority of the shunt capacitance of the transmission line. The JTWPA of FIG. 1 is a coplanar waveguide.

The JTWPA of FIG. 1 is further furnished with a flux bias line, FBL, 130. Flux bias line 130 is a two-port circuit that takes a serpentine path, ranging from one side of the coplanar waveguide to the other. The flux bias line 130 forms an upper electrode of the parallel-plate capacitors 120 in places where it crosses over to another side of the waveguide, as illustrated in FIG. 1. The flux bias line 130 connects to the ground planes of the transmission line through resistors 140, the value of which is much smaller than the reactive impedance of the capacitors 120, at the relevant frequencies fI, fS and fP. The purpose of the resistors 140 is to provide an rf path to ground from the parallel-plate capacitors 120. At the same time, the resistors 140 and the flux bias line 130 enforce a similar electric potential of the ground planes at the frequencies fI, fS, and fP.

As illustrated, flux bias line 130 extends on one side of the waveguide, parallel to the waveguide, before ranging over to another side of the waveguide at a place corresponding to one of the parallel-plate capacitors 120, to again extend parallel to the waveguide on said another side of the waveguide. Where flux bias line 130 extends parallel to the waveguide, it may be connected, as illustrated, with the resistors 140, each of which may form a loop surrounding a contact hole 150. Resistors 140 comprise metal layers in the present multi-layer JTWPA. Resistors 140 partly overlay the superconducting material to form a contact, wherein the resistive aspect of resistors 140 is generated where the resistors 140 overlay an insulator, and not the superconductor.

Operating parameters of the Josephson elements 110 include that these elements have at least two large Josephson junctions on one half of a loop and one small Josephson junction on the other half of the loop is used. In particular, there may be two and only two large Josephson junctions on one half of a loop and one and only one small Josephson junction on the other half of the loop. Further, the critical current of the small junction is smaller than the critical current of the larger junctions by a factor of alpha. In the present Josephson elements 110, alpha may be 0.27. Further, the magnetic flux threading through the loops of elements 110 may in the present solution be 0.40 times the magnetic flux quantum. Thus one parameter combination could be two large Josephson junctions and one smaller one, their relation being 0.27 and the magnetic field amounting to 0.40 times the flux quantum.

Dissipation of the resistors adds to the dielectric loss of parallel-plate capacitors 120. A dc current in the flux bias line 130 generates the magnetic field gradient for the Josephson elements 110. The resistors 140 prevent the leakage of this current to the ground plane, and they also prevent the formation of superconductive loops from the ground planes and cross-overs. Such superconductive loops could cause the magnetic flux to quantize. A current source floating with respect to the waveguide ground may be provided for generating the dc current in flux bias line 130.

The amount of dissipation in the transmission line can be expressed through an effective loss tangent of the parallel-plate capacitors 120. Both the pump current and the pump voltage experience an exponential decay due to the dissipation when the characteristic impedance is constant along the transmission line. It would be desirable if a fixed ratio were maintained between Ip and Ic to ensure that the mixing process remains strong in spite of the dissipation. To this end, either position dependent capacitance or position dependent critical current may be applied. The expression for a position-dependent shunt capacitance, that mainly consists of the parallel-plate capacitors 120, is derived below. The capacitance variation maintains a fixed pump current magnitude along the transmission line, at the expense of a faster decay of the pump voltage magnitude. From the input to the output to the TWPA, the shunt capacitance 120 will increase. The characteristic impedance will decrease accordingly, and an impedance-matching device may be employed at the output of the device. Examples of an impedance-matching devices are a Klopfenstein taper and exponential taper In the following, the following notations are employed:
a: unit cell physical length
G: shunt conductance of the unit cell
V: voltage
C: unit cell capacitance
$C_0$: line capacitance at the input, i.e., at x=0
tan δ: loss tangent of C
ω: angular frequency
L: unit cell inductance
x: physical coordinate
Z: characteristic impedance The power dissipated within an unit cell reads Re{VG*V*}/2, and the total dissipation from the TWPA input until the position x is an integral:

$$\int_0^x \frac{G|V|^2}{2a} dx'$$

We write V=ZI where the current magnitude is assumed to be constant, and $Z=\sqrt{L/C}$. Further inserting G=omega*C*tan δ, $$\int_0^x \frac{\omega C (\tan\delta) Z^2 |I|^2}{2a} dx' = \frac{x\omega L(\tan\delta)|I|^2}{2a}$$

Importantly, this dissipation does not change with the possible variation of C. On the other hand, we consider the power delivered to position x, that is, $$\frac{\text{Re}\{VI^*\}}{2} = \frac{Z|I|^2}{2} = \frac{\sqrt{L}\,|I|^2}{2\sqrt{C}}$$

The self-consistent solution for constant then presents itself as $$\frac{1}{\sqrt{C}} = \frac{1}{\sqrt{C_0}} - \frac{x\omega\sqrt{L}\tan\delta}{a}.$$

Technical effects enabled by the present embodiments include eliminating a magnetic shield for superconductive circuits, which typically comprises a combination of high-permeability and superconductive layers. The gradiometric design of the Josephson element relaxes the magnetic shielding requirement of the Kerr-free TWPA, allowing savings in the system cost and size. The gradiometric layout of the Kerr-free Josephson element makes the element sensitive to a magnetic field gradient only, as opposed to also being responsive to the magnitude of the magnetic field. Furthermore, the ability to keep the ratio between the pump current and critical current at a fixed value enables higher gain of the TWPA. Parameter selection for the Kerr-free Josephson element render the element first order insensitive to errors in the size of the smallest Josephson junction. Further, the flux bias line 130 produces the necessary magnetic field gradient, and connects to the transmission line ground with low-valued resistors. A gradual modification of the transmission line impedance along the line maintains a constant ratio between Ip and Ic.

Figure 2:
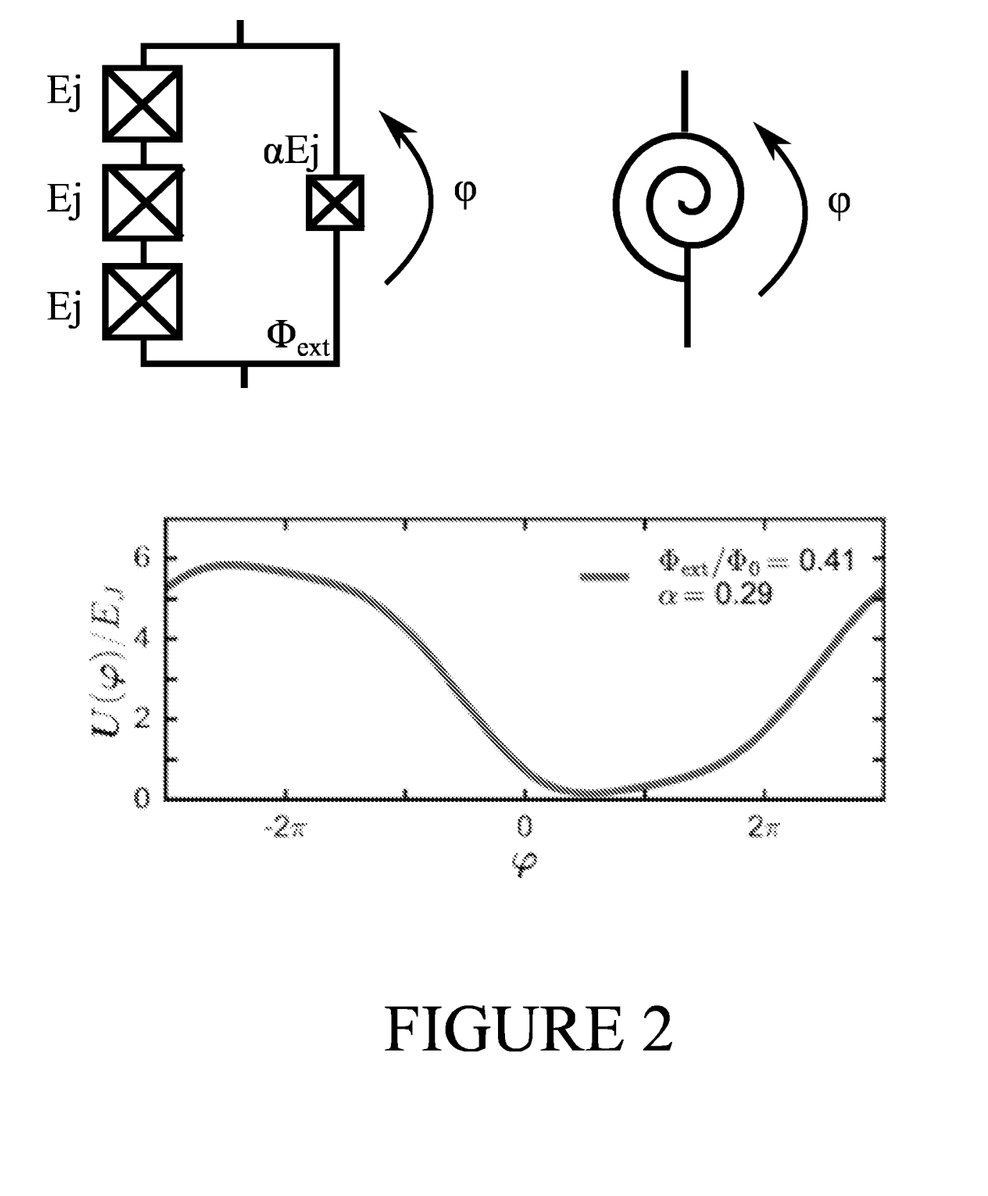
FIG. 2 illustrates an example Josephson element in accordance with document [2]

FIG. 2 illustrates an example Josephson element in accordance with document [2]. In the upper half of the image, a Josephson element is illustrated with three large junctions on one half of a loop and one small Josephson junction on the other half of the loop. The Josephson energies of the junctions relate to each other with the ratio α, as illustrated.

The lower part of the figure illustrates an example potential for the parameter set α=0.29, $\Phi_{ext}/\Phi_0$=0.41. In other words, here the external magnetic field is 0.41 times the flux quantum. This obtains third-order nonlinearity without fourth-order nonlinearity, in other words, $c_3 \neq 0$ and $c_4=0$.

Where the Josephson element has one small junction and n large junctions, the parameter set may be determined as follows. An inductive energy of the Josephson element may be expressed as $$U_{SNAIL}(\varphi) = -\alpha E_J \cos(\varphi) - nE_J \cos\left(\frac{\varphi_{ext} - \varphi}{n}\right)$$

where φ is a superconducting phase over the small junction, a the ratio of the junction sizes, $E_J$ the Josephson energy of the large junction(s) and $\varphi_{ext}$ is the reduced external magnetic flux:

$$\varphi_{ext} = 2\pi \Phi_{ext}/\Phi_0$$

$\Phi_{ext}$ is the external magnetic flux and $\Phi_0$ is the magnetic flux quantum, a natural constant h/(2e). Here h is Planck's constant and e the electron charge.

Phase 1: a minimum of the inductive energy is sought as a function of φ. The φ at the said minimum is denoted $\varphi_{min}$. The search may be limited to parameter space α<1/n, to avoid having plural minima. In parameter space α>=1/n there exists a risk, that for some values of next there exists more than one minimum. The case of the plural minima results in an unwanted hysteresis of the Josephson element.

Phase 2: a Taylor expansion is developed for the effective potential $U_{eff}$ that describes φ-dependence of the inductive energy near the minimum.

$$\overline{\varphi} = \varphi - \varphi_{min} U_{eff}(\overline{\varphi})/E_J = c_2 \overline{\varphi}^2 + c_3 \overline{\varphi}^3 + c_4 \overline{\varphi}^4 + \ldots$$

Phase 3: $c_2$ is investigated as a function of α and $\Phi_{ext}$ to establish, where $dc_2/d\alpha=0$.

Phase 4: $c_4$ is investigated as a function of α and $\Phi_{ext}$ to establish, where $c_4=0$.

Phase 5: An optimal parameter pair (α, $\Phi_{ext}$) is established, where both $dc_2/d\alpha=0$ and $c_4=0$. Here also $c_3 \neq 0$. Optimal parameters for n=2 and n=3 are presented below:

| n | α | $\Phi_{ext}/\Phi_0$ | $c_3$ | $c_4$ |
|---|---|---|---|---|
| 2 | 0.27 | 0.40 | −0.030 | 0 |
| 3 | 0.12 | 0.36 | −0.016 | 0 |

Figure 3:
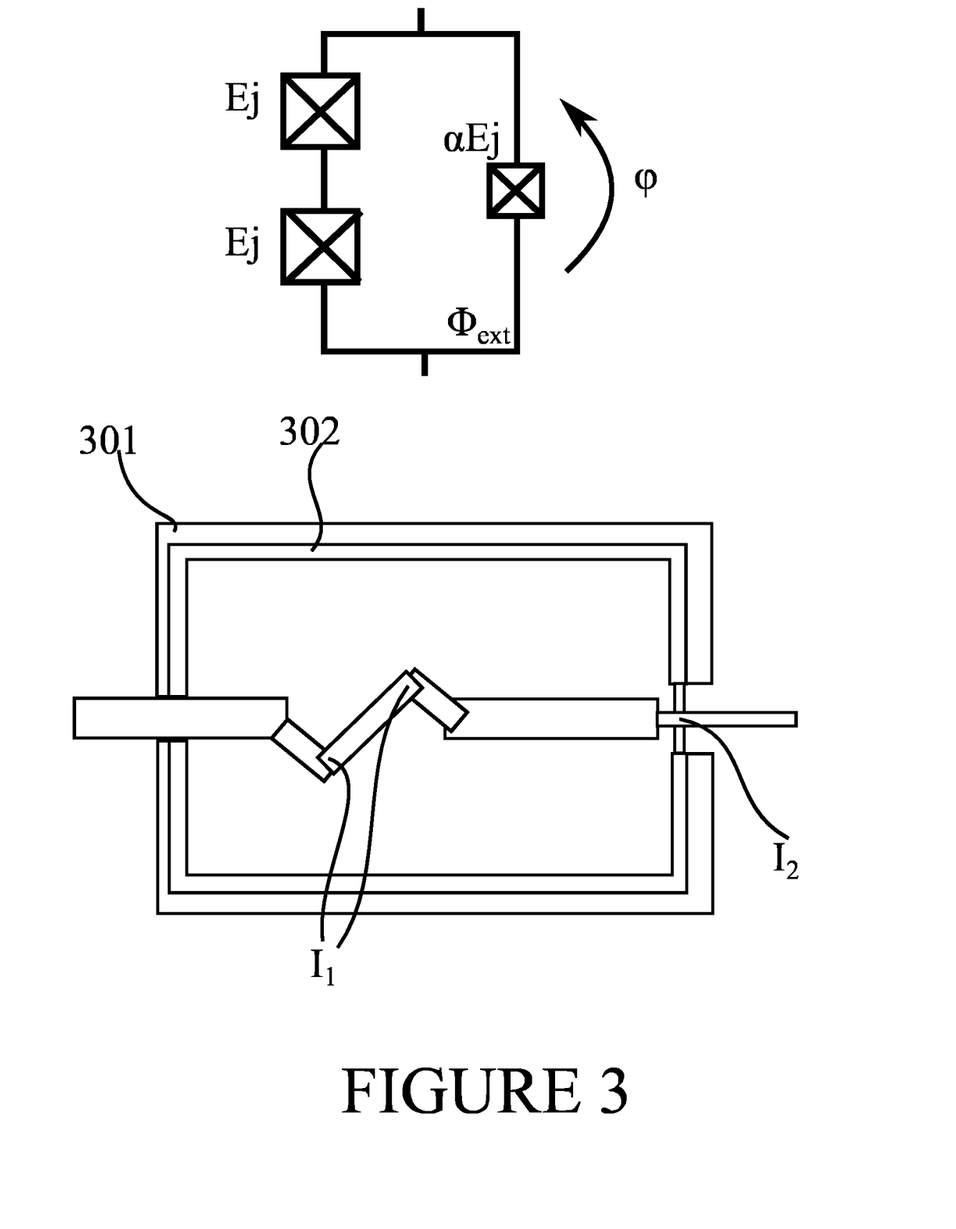
FIG. 3 illustrates an example Josephson element in accordance with at least some embodiments of the present invention.

FIG. 3 illustrates an example Josephson element in accordance with at least some embodiments of the present invention. In the upper half of the figure, a Josephson element is illustrated, with two large Josephson junctions on one half of a loop, and one smaller Josephson junction on the other half of the loop.

At the lower part of the figure, a gradiometric Josephson element is illustrated, with n=2 larger Josephson junctions $I_1$, and one smaller Josephson junction $I_2$, as in the upper part of the figure. A superconducting part 301 and tunnel junction 302 are comprised in the Josephson element. Two junctions of critical current $I_1$ and one junction of critical current $I_2$ are illustrated, with their Josephson energies relating to each other by α, as in the upper part of the figure.

The loops are in practice relatively easy to manufacture such that they are symmetric. Example values for the junctions are $I_1$=13.7 μA and $I_2$=3.7 μA. A Josephson inductance series expansion of this element at the optimal $\Phi_{ext}$ would amount to 5 μA times [1+0.50(Ip/Ic)+0.00(Ip/Ic)$^2$+ . . . ]. The illustrated element is first-order insensitive to errors in the small junction size, $I_2$.

Figure 4:
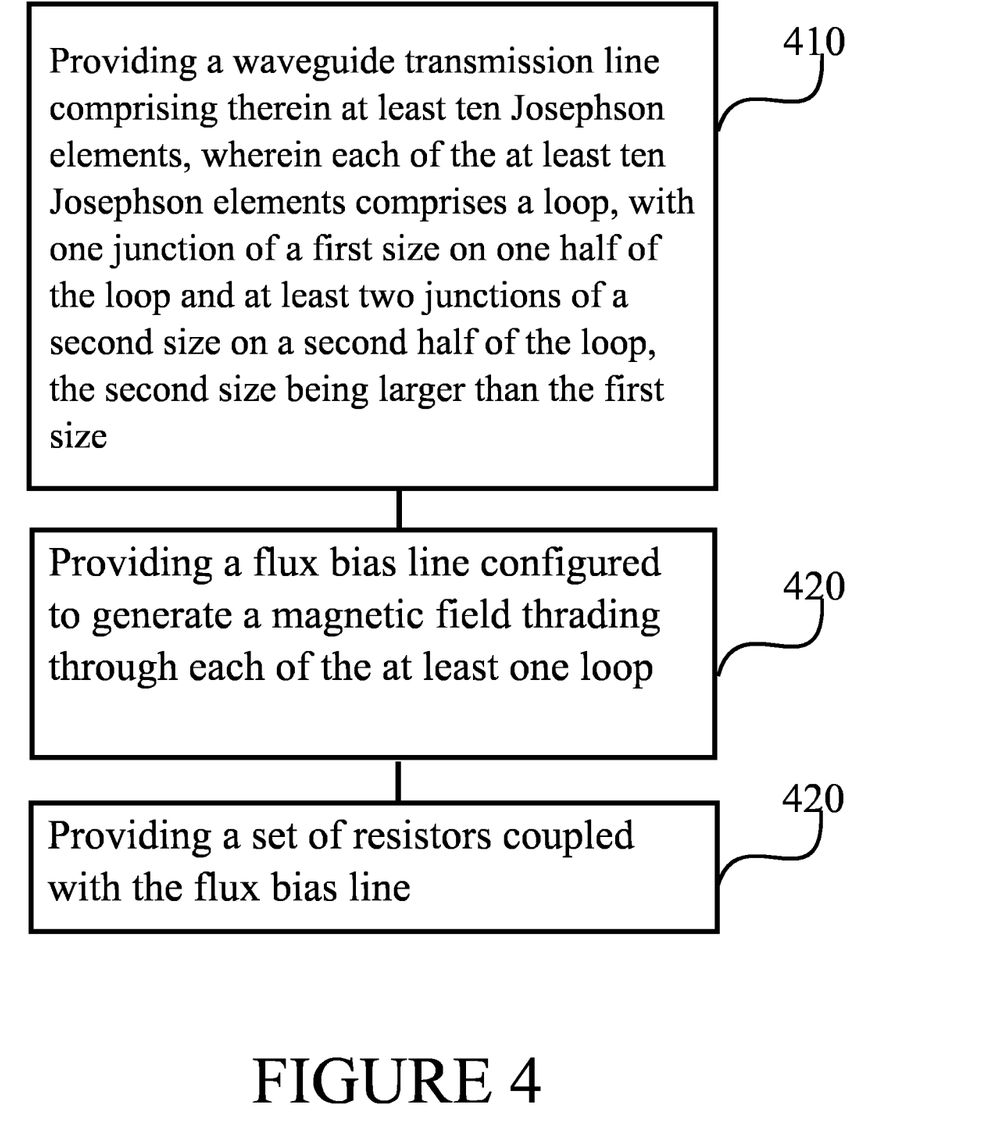
FIG. 4 is a flow graph of a method in accordance with at least some embodiments of the present invention.

FIG. 4 is a flow graph of a method in accordance with at least some embodiments of the present invention. The phases of the illustrated method may be performed in a factory apparatus, an auxiliary device or a personal computer, for example, or in a control device configured to control the functioning thereof, when installed therein.

Phase 410 comprises providing a waveguide transmission line comprising therein at least ten Josephson elements, wherein each of the at least ten Josephson elements comprises a loop, with one junction of first size on one half of the loop and at least two junctions of a second size on a second half of the loop, the second size being larger than the first size. Phase 420 comprises providing a flux bias line configured to generate a magnetic field threading each of the at least one loop. Phase 430 comprises providing a set of resistors coupled with the flux bias line.

The junctions may comprise Josephson junctions, as described herein above. The flux bias line may generate the magnetic field gradient required once the dc current is applied to traverse it. By exactly one it is meant one and no more than one, and by exactly two it is meant two and no more than two.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to one embodiment or an embodiment means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment. Where reference is made to a numerical value using a term such as, for example, about or substantially, the exact numerical value is also disclosed.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the preceding description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", that is, a singular form, throughout this document does not exclude a plurality.

INDUSTRIAL APPLICABILITY

At least some embodiments of the present invention find industrial application in amplification of low-amplitude signals.

ACRONYMS LIST fI Idler frequency
fP Oscillator/pump frequency
fS Signal frequency
Ic Critical current of Josephson junction
Ip Pump current amplitude
JTWPA Josephson traveling wave parametric amplifier
SQUID superconducting quantum interference device
TWPA traveling wave parametric amplifier

REFERENCE SIGNS LIST

| | |
|---|---|
| 110 | Josephson element |
| 120 | Shunt capacitor (parallel-plate capacitor) |
| 130 | Flux bias line |
| 140 | Resistor |
| 150 | Contact hole |
| 101 | Wiring layer element |
| 301 | Superconducting part |
| 302 | Tunnel Junction |
| 410-420 | Phases of the method of FIG. 4 |

CITATION LIST

[1] A. B. Zorin: "Josephson traveling-wave parametric amplifier with three-wave mixing", arXiv: 1602.026550v3, 19 Sep. 2016.
[2] N. E. Frattini, U. Vool, S. Shankar, A. Narla, K. M. Sliwa and M. H. Devoret, "3-wave mixing Josephson dipole element", arXiv: 1702.00869v3, 1 Jun. 2017.

The invention claimed is:

1. A travelling wave parametric amplifier comprising:
a coplanar waveguide transmission line comprising therein at least ten Josephson elements, wherein each of the at least ten Josephson elements comprises a loop, with exactly one Josephson junction of first size on one half of the loop and at least two Josephson junctions of a second size on a second half of the loop, the second size being larger than the first size;
a flux bias line configured to generate a magnetic flux threading each of the at least one loop, comprising a two-port circuit taking a path ranging repeatedly from one side of the coplanar waveguide transmission line to the other, crossing over the coplanar waveguide transmission line at a place corresponding to a parallel-plate capacitor disposed on the coplanar waveguide transmission line, and
a set of resistors coupling the flux bias line to the ground planes of the coplanar waveguide transmission line.

2. The travelling wave parametric amplifier according to claim 1, wherein each of the at least ten Josephson elements does not exhibit Kerr nonlinearity at, or exhibits a negligible contribution of Kerr nonlinearity, and wherein each of the at least ten Josephson elements does exhibit three-wave mixing.

3. The travelling wave parametric amplifier according to claim 1, wherein a ratio of a Josephson energy of the junction of the first size to a Josephson energy of the junction of the second size is configured so as to partially or completely eliminate said Kerr nonlinearity.

4. The travelling wave parametric amplifier according to claim 3, wherein the said ratio of the Josephson energies is configured by areas of the junctions.

5. The travelling wave parametric amplifier according to claim 3, where the said ratio of the Josephson energies is configured by the superconducting critical current density of the junctions.

6. The travelling wave parametric amplifier according claim 1, wherein the travelling wave parametric amplifier is configured to enable generation of a current in the flux bias line so that the magnetic flux threading the said loop corresponds to an operation point minimizing said Kerr nonlinearity.

7. The travelling wave parametric amplifier according to claim 1, wherein the magnetic flux threading each of the at least one loop amounts to 0 times a magnetic flux quantum, and wherein each of the at least ten Josephson elements comprises exactly two junctions of the second size on a second half of the loop, wherein a Josephson energy of a junction of the first size is 0.27 times the Josephson energy of a junction of the second size.

8. The traveling wave parametric amplifier according claim 1, wherein the coplanar waveguide transmission line comprises more than fifteen of the Josephson elements.

9. The traveling wave parametric amplifier according to claim 1, wherein the flux bias line forms an upper or lower electrode of parallel plates which form shunt capacitors of the coplanar waveguide transmission line, the shunt capacitors being the parallel-plate capacitors.

10. The traveling wave parametric amplifier according to claim 9, wherein the flux bias line connects to ground planes of the coplanar waveguide transmission line through the resistors which have smaller values than a reactive impedance of the shunt capacitors at frequencies which the traveling wave parametric amplifier is configured to amplify.

11. The traveling wave parametric amplifier according claim 9, wherein the traveling wave parametric amplifier is configured to apply a dc current in the flux bias line to generate a magnetic field gradient.

12. The traveling wave parametric amplifier according to claim 11, wherein the each of the loops is configured in a gradiometric configuration to be insensitive to homogeneous magnetic fields from the ambient.

13. The traveling wave parametric amplifier according to claim 9, wherein the coplanar waveguide transmission line comprises sets of two Josephson elements, the sets separated from each other by the shunt capacitors arranged on the coplanar waveguide transmission line.

14. The travelling wave parametric amplifier according to claim 9, wherein the value of the shunt capacitors is not constant along the wave propagation direction of the transmission line to compensate for microwave attenuation along the transmission line.

15. The traveling wave parametric amplifier according to claim 1, further comprising an impedance matching device at at least one end of the coplanar waveguide transmission line.

16. The traveling wave parametric amplifier according to claim 15, wherein the impedance matching device comprises a tapered transmission line matching element.

17. The travelling wave parametric amplifier according to claim 16, wherein the tapered transmission line matching element comprises a Klopfenstein taper.

18. The travelling wave parametric amplifier, according to claim 16, wherein the tapered transmission line matching element comprises an exponential taper.

19. A method for manufacturing a traveling wave parametric amplifier comprising:
providing a coplanar waveguide transmission line comprising therein at least ten Josephson elements, wherein each of the at least ten Josephson elements comprises a loop, with exactly one junction of first size on one half of the loop and at least two junctions of a second size on a second half of the loop, the second size being larger than the first size;
providing a flux bias line configured to generate a magnetic field threading each of the at least one loop comprising a two-port circuit taking a path ranging repeatedly from one side of the coplanar waveguide transmission line to the other, crossing over the coplanar waveguide transmission line at a place corresponding to a parallel-plate capacitor disposed on the coplanar waveguide transmission line, and
providing a set of resistors coupling the flux bias line to the ground planes of the coplanar waveguide transmission line.

* * * * *